(12) United States Patent
Koyanagi (10) Patent No.: US 6,448,918 B1
(45) Date of Patent: Sep. 10, 2002

(54) DIGITAL/ANALOG CONVERTER

(75) Inventor: Yukio Koyanagi, Saitama (JP)

(73) Assignee: Yasue Sakai, Urawa (JP)

( * ) Notice: Subject to any disclaimer, the term of this patent is extended or adjusted under 35 U.S.C. 154(b) by 0 days.

(21) Appl. No.: 09/890,538

(22) PCT Filed: Dec. 15, 2000

(86) PCT No.: PCT/JP00/08903

§ 371 (c)(1),
(2), (4) Date: Jul. 31, 2001

(87) PCT Pub. No.: WO01/45270

PCT Pub. Date: Jun. 21, 2001

(30) Foreign Application Priority Data

Dec. 18, 1999 (JP) .............................. 11-376793

(51) Int. Cl.$^7$ ................................. H03M 1/66
(52) U.S. Cl. .................. 341/144; 341/143; 341/146; 341/147; 341/120; 341/128; 341/129
(58) Field of Search ................. 341/143, 144, 341/146, 147, 120, 128, 129

(56) References Cited

U.S. PATENT DOCUMENTS 4,167,731 A  9/1979 Eggermont 6,323,795 B1 * 11/2001 Yang et al. .................. 341/143

FOREIGN PATENT DOCUMENTS

JP  4-61509   2/1992
JP  5-55875   3/1993

* cited by examiner

*Primary Examiner*—Patrick Wamsley
*Assistant Examiner*—Lam T. Mai
(74) *Attorney, Agent, or Firm*—Dellett and Walters (57) ABSTRACT

It is object to provide a digital-to-analog converter capable of generating an output waveform having less distortion without increasing the operating speed of components. A D/A converter comprises a multiplying section 1, four data holding sections 2-1 through 2-4, four data selectors 3-1 through 3-4, an adding section 4, a D/A converter 5, and two integrating circuits 6-1 and 6-2. Input data is multiplied by four multiplicators by the multiplying section 1, and the four multiplication results are held, as one set, in the data holding sections. The data selectors read out the data held in the four data holding sections in a predetermined order and generate step function data. The adding section adds the values of the step functions outputted from the four data selectors. Furthermore, a stepwise analog voltage corresponding to the sum is generated by the D/A converter 5 and integrated twice by means of the two integrating circuits 6-1 and 6-2.

7 Claims, 6 Drawing Sheets

DIGITAL/ANALOG CONVERTER

TECHNICAL FIELD

The present invention relates to a digital-to-analog converter for converting discrete digital data into continuous analog signals. In this specification, it is assumed that a case where function values have finite values except zero in a local region and become zero in regions different from the region is called a "local support."

BACKGROUND ART

A recent digital audio apparatus, for example, a CD (Compact Disk) player, uses a D/A (digital-to-analog) converter to which an over-sampling technique is applied to obtain a continuous analog audio signal from discrete music data (digital data). Such a D/A converter generally uses a digital filter to raise a pseudo sampling frequency by interpolating input digital data, and outputs smooth analog audio signals by passing each interpolation value through a low-pass filter after generating a staircase signal waveform with each interpolation value held by the sample holding circuit.

A data interpolation system disclosed in WO99/38090 is well known as a method of interpolating data into discrete digital data. In this data interpolation system, differentiation can be performed only once in the whole range, and a sampling function is used such that two sampling points each before and after an interpolation position, that is, a total of four sampling points, can be considered. Since the sampling function has values of a local support unlike the sinc function defined by sin $(\pi ft)/(\pi ft)$ where f indicates a sampling frequency, there is a merit that no truncation errors occur although only four pieces of digital data are used in the interpolating operation.

Generally, oversampling is performed by using a digital filter in which the waveform data of the above mentioned sampling function is set to a tap coefficient of an FIR (finite impulse response) filter.

If the oversampling technology of performing an interpolating operation for discrete digital data using the above mentioned digital filter, a low pass filter having a moderate attenuation characteristic can be used. Therefore, the phase characteristic with a low pass filter can approach a linear phase characteristic, and the sampling aliasing noise can be reduced. These effects are more outstanding with a higher oversampling frequency. However, if the sampling frequency becomes higher, the performance of the digital filter and the sample hold circuit is also sped up. Therefore, it is necessary to use expensive parts appropriate for the quick performance, thereby increasing the cost of the required parts. In addition, when the sampling frequency is high (for example, several MHz) as in the case of image data, it is necessary to configure a digital filter or a sample hold circuit using parts operable at several tens MHz to several hundreds MHz, which cannot be easily realized.

Additionally, although the oversampling technology is used, a smooth analog signal is generated by passing a signal waveform in the form of steps through a low pass filter. Therefore, a desired linear phase characteristic cannot be realized so far as a low pass filter is used, and an output waveform is distorted.

BRIEF SUMMARY OF THE INVENTION

The present invention has been achieved to solve the above mentioned problems, and aims at providing a digital-to-analog converter capable of obtaining an output waveform having less distortion without speeding up the operations of the parts.

In the digital-to-analog converter according to the present invention, multiplying unit performs a plurality of multiplying processes using plural multiplicators on a plurality of digital data input at predetermined intervals, and using the plurality of multiplication result, step functions are generated corresponding to each inputted digital data. After stepwise voltage wave form generation unit have generated a stepwise analog voltage corresponding to the digital data obtained by adding unit adding up values of the step functions corresponding to each digital data, a plurality of integrating unit perform analog integration several times, and continuous analog signals smoothly connecting voltage values corresponding to sequentially input respective digital data are generated. Thus, the values of the step functions corresponding to sequentially input plural pieces of digital data are added up, and then the addition result is converted into an analog voltage and integrated, thereby obtaining continuously changing analog signals. As a result, it is not necessary to use a low pass filter to obtain a final analog signal, a group delay characteristic is not deteriorated by different phase characteristics depending on the applicable signal frequencies, and therefore an output waveform can be obtained with less distortion. As compared with the conventional method used with oversampling, the cost of parts can be reduced because it is not necessary to speed up the operations of the parts and to use expensive parts.

Each of the multiplicators used in the multiplying processes by the multiplying unit is desired to correspond to each of the values of step functions obtained by differentiating plural times piecewise polynomials for a predetermined sampling function configured by the piecewise polynomials. That is, by integrating plural times the above mentioned step function, a waveform corresponding to the predetermined sampling function can be obtained. Therefore, a convolution operation using a sampling function can be equivalently realized by generating a step function. As a result, the contents of the entire process can be simplified, and the number of processes required converting digital data into analog data can be successfully reduced.

In addition, the above mentioned step function is desired to equally set the positive and negative areas. Thus, the divergence of integration results of the integrating unit can be prevented.

Furthermore, it is desirable that the above mentioned sampling function has a value of local support with the whole range differentiable only once. It is assumed that a natural phenomenon can be approximated if the whole range is differentiable only once. By setting a smaller number of times of differentiation, the times of the analog integration performed by the integrating unit can be reduced, thereby successfully simplifying the configuration.

It is further desirable that the above mentioned step function contains an area of eight piecewise sections in equal width weighted by −1, +3, +5, −7, −7, +5, +3, and −1 in a predetermined range corresponding to five pieces of digital data arranged at equal intervals, and that the eight weight coefficients are set as the respective multiplicators of multiplying unit. Since simple weight coefficients can be used as the multiplicators in the multiplying un it, the multiplying process can be simplified.

Especially, it is desirable that a multiplying process performed in the multiplying unit is realized by adding digital data to an operation result of the exponentiation of 2 by a bit shift. Since the multiplying process can be replaced with a bit shift process and an adding operation, the configuration can be simplified and the process can be sped up by simplifying the contents of the processes.

It is also desirable that the times of the analog integration is two, and an analog signal whose voltage level changes like a quadric function is output from the integrating unit. By interpolating an analog signal which changes like a quadric function into a voltage value corresponding to discrete digital data, a desired output waveform can be obtained without unnecessary high frequency components, etc.

BEST MODE FOR CARRYING OUT THE INVENTION

Figure 1:
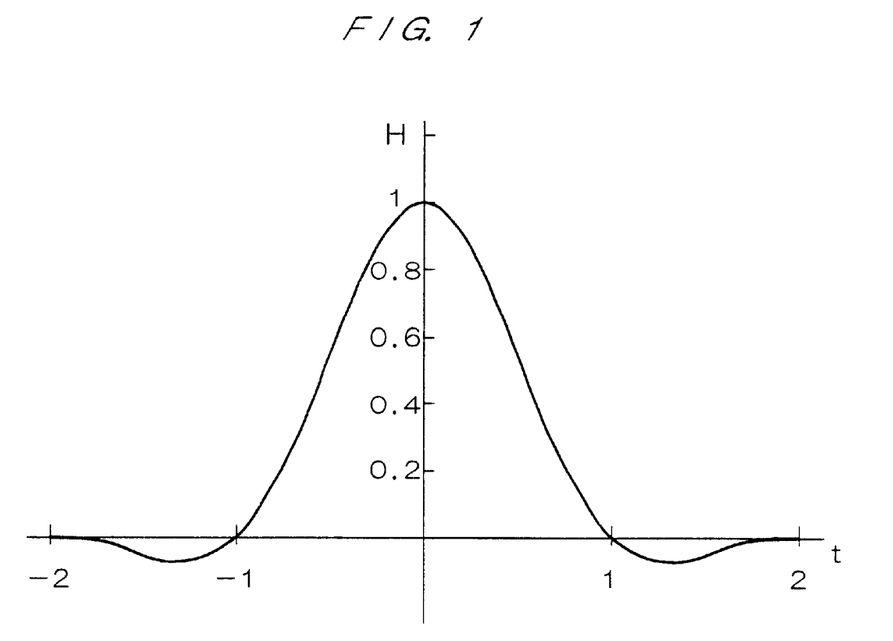
FIG. 1 is a diagram showing a sampling function used in an interpolating operation in the D/A converter according to an embodiment.

An embodiment of the D/A converter according to the present invention is described below in detail by referring to the attached drawings. FIG. 1 shows a sampling function used in an interpolating operation in the D/A converter according to the present embodiment. The sampling function H(t) is disclosed by WO99/38090, and represented by the following expressions.

| | |
|---|---|
| $(-t^2-4t-4)/4$ | ; $-2 \leq t < -3/2$ |
| $(3t^2+8t+5)/4$ | ; $-3/2 \leq t < -1$ |
| $(5t^2+12t+7)/4$ | ; $-1 \leq t < -1/2$ |
| $(-7t^2+4)/4$ | ; $-1/2 \leq t < 0$ |
| $(-7t^2+4)/4$ | ; $0 \leq t < 1/2$ |
| $(5t^2-12t+7)/4$ | ; $1/2 \leq t < 1$ |
| $(3t^2-8t+5)/4$ | ; $1 \leq t < 3/2$ |
| $(-t^2+4t-4)/4$ | ; $3/2 \leq t \leq 2 \ldots$ (1) | where t=0, ±1, ±2 indicates the sampling position. The sampling function H(t) shown in FIG. 1 can be differentiated only once in the whole range, and is a function of a local support converging into 0 with the sampling position t=±2. By performing an overlapping process using the sampling function H(t) based on each sampling value, the interpolating process can be performed using a function differentiable only once in the sampling values.

Figure 2:
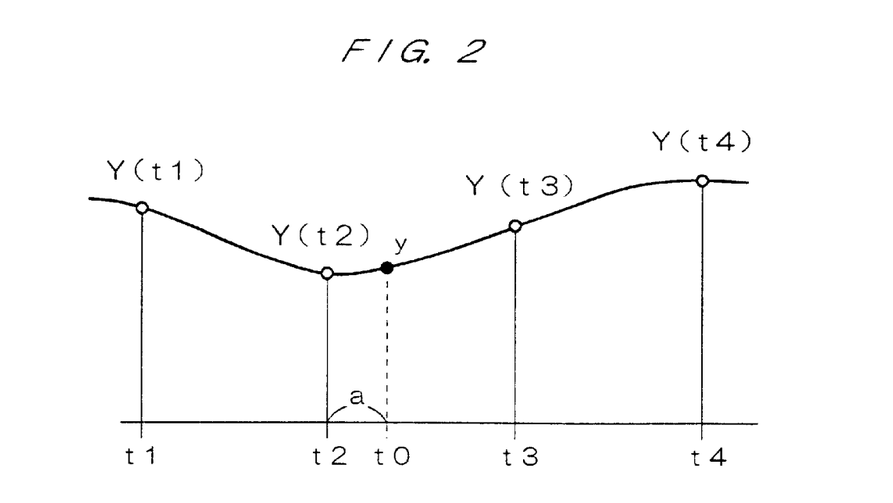
FIG. 2 is a diagram showing a relationship between the sampling values with an interpolation values.

FIG. 2 shows the relationship between the sampling values and the interpolation values. As shown in FIG. 2, assume that four sampling positions are t1, t2, t3, and t4, and the distance between two adjacent sampling positions is 1. The interpolation value y corresponding to the interpolation position t0 between the sampling positions t2 and t3 is obtained by the following equation.

$$y=Y(t1) \cdot H(1+a)+Y(t2) \cdot H(a) +Y(t3) \cdot H(1-a)+Y(t4) \cdot H(2-a) \ldots \quad (2)$$

where Y(t) indicates each sampling value at the sampling position t. Each of 1+a, a, 1−a, and 2−a indicates the distance between the interpolation position t0 and each of the sampling positions t1 through t4.

As described above, by performing a convolution operation by computing the value of the sampling function H(t) corresponding to each sampling value, an interpolation value of sampling values can be obtained theoretically. However, the sampling function shown in FIG. 1 is a quadric piecewise polynomial differentiable only once in the whole range. Using this feature, the interpolation value can be obtained in another equivalent process procedure.

Figure 3:
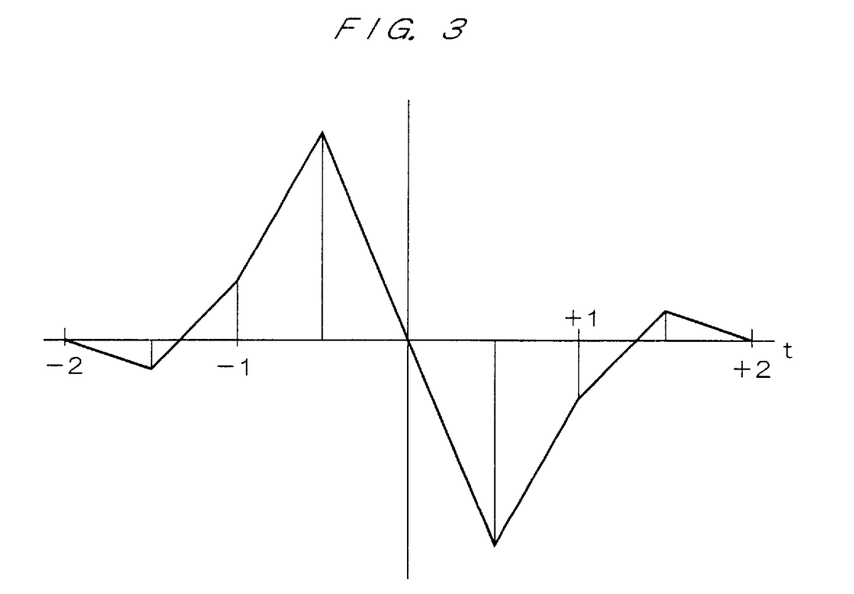
FIG. 3 is a diagram showing a waveform obtained by differentiating once the sampling function shown in FIG. 1.

FIG. 3 shows a waveform obtained by differentiating once the sampling function shown in FIG. 1. The sampling function H(t) shown in FIG. 1 is a quadric piecewise polynomial differentiable once in the entire range. Therefore, by performing the differentiation once, a polygonal line function formed by the waveform of a continuous polygonal line as shown in FIG. 3 can be obtained.

Figure 4:
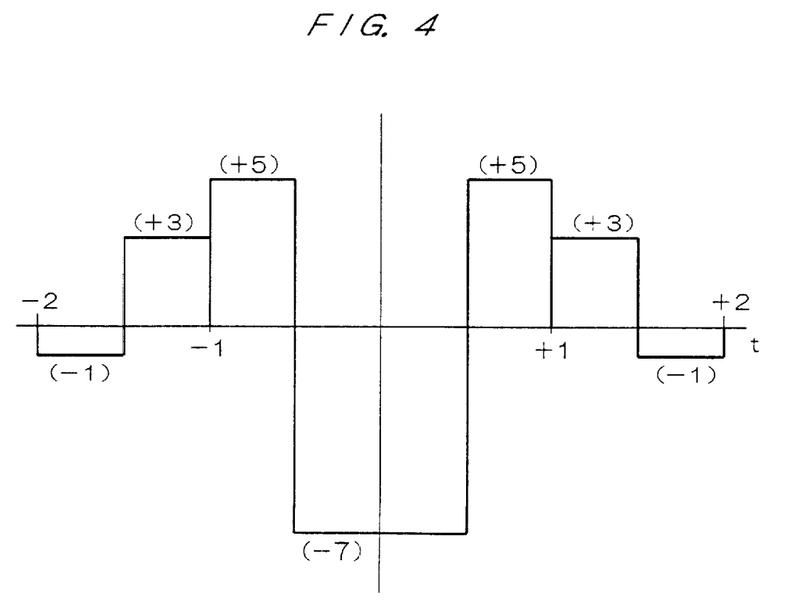
FIG. 4 is a diagram showing a the waveform obtained by further differentiating the polygonal line function shown in FIG. 3.

FIG. 4 shows the waveform obtained by further differentiating the polygonal line function shown in FIG. 3. However, the polygonal line waveform contains a plurality of corner points, and the differentiation cannot be performed in the whole range. Therefore, the differentiation is performed on the linear portion between two adjacent corner points. By differentiating the polygonal line waveform shown in FIG. 3, the step function formed by the stepwise waveform as shown in FIG. 4 can be obtained.

Thus, the above mentioned sampling function H(t) is once differentiated in the entire range to obtain a polygonal line function. By further differentiating each of the linear portions of the polygonal line function, a step function can be obtained. Therefore, in the reverse order, by generating the step function shown in FIG. 4, and integrating it twice, the sampling function H(t) shown in FIG. 1 can be obtained.

In the step function shown in FIG. 4, the positive and negative regions are set equal to each other, and the sum of the regions equals 0. That is, by integrating such a step function plural times, a sampling function of local support, as shown in FIG. 1, whose differentiability in the whole range is guaranteed can be obtained.

In computing the interpolation value in the convolution operation shown by the equation (2), the value of the sampling function H(t) is multiplied by each sampling value. If the sampling function H(t) is obtained by integrating twice the step function shown in FIG. 4, the value of the sampling function obtained in the integrating process is multiplied by each sampling value, or equivalently, when a step function before the integration processing is generated, an interpolation value can be obtained by generating a step function by multiplication by each sampling value, and performing twice the integrating process on the result obtained in the convolution operation using the step function. The D/A converter according to the present embodiment obtains an interpolation value as described above. This process is described below in detail.

Figure 5:
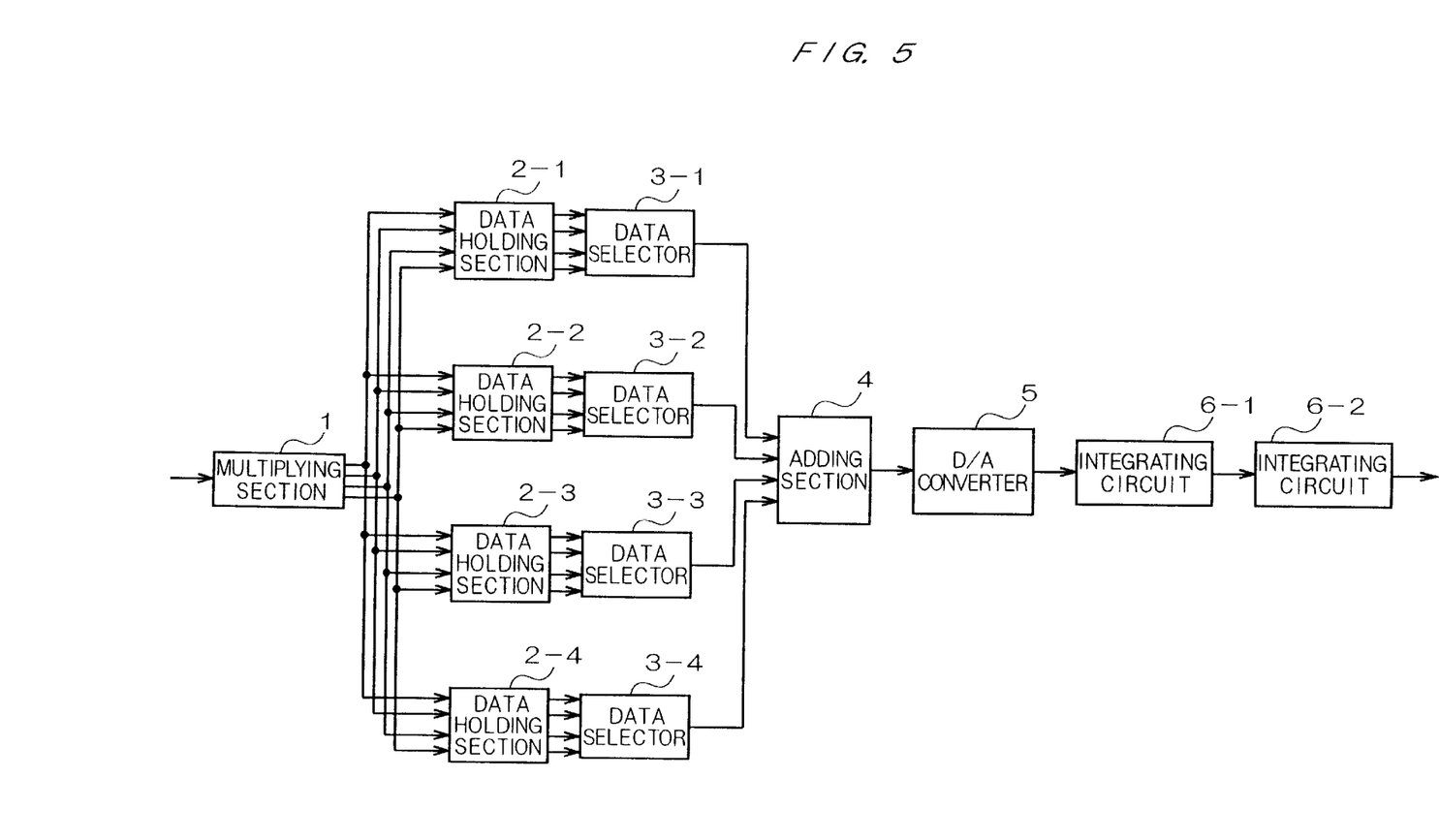
FIG. 5 is a diagram showing a the configuration of a D/A converter of an embodiment.

FIG. 5 shows the configuration of the D/A converter according to the present embodiment. The D/A converter shown in FIG. 5 is configured by multiplying section 1, four data holding sections 2-1, 2-2, 2-3, and 2-4, four data selectors 3-1, 3-2, 3-3, and 3-4, adding section 4, a D/A converter 5, and two integrating circuits 6-1 and 6-2.

The multiplying section 1 outputs a result of multiplying discrete digital data sequentially input at predetermined time intervals by a multiplicator corresponding to each value of the step function shown in FIG. 4. Each value of the step functions shown in FIG. 4 can be obtained by twice differentiating each piecewise polynomial of the above mentioned equation (1) as follows.

| | |
|---|---|
| −1 | ; −2 ≤ t < −3/2 |
| +3 | ; −3/2 ≤ t < −1 |
| +5 | ; −1 ≤ t < −1/2 |
| −7 | ; −1/2 ≤ t < 0 |
| −7 | ; 0 ≤ t < 1/2 |
| +5 | ; 1/2 ≤ t < 1 |
| +3 | ; 1 ≤ t < 3/2 |
| −1 | ; 3/2 ≤ t ≤ 2 |

Therefore, the multiplying section 1 multiplies the input data D by four types of the value corresponding to the above mentioned step functions as multiplicators (−1, +3, +5, and −7), when the data D is input, and concurrently outputs a set of four-piece data, that is, −D, +3D, +5D, and −7D.

The data holding sections 2-1 through 2-4 cyclically fetch a set of four-piece data output from the multiplying section 1, and hold the data until the next fetching timing. For example, a set of four-piece data output from the multiplying section 1 corresponding to the first input data is fetched and held in the data holding section 2-1, and a set of four-piece data output from the multiplying section 1 corresponding to the second input data is fetched and held in the data holding section 2-2. Similarly, each set of four-piece data output from the multiplying section 1 corresponding to the third and fourth input data is fetched and held in the data holding section 2-3, and 2-4, respectively. When a cycle of the data holding operation is completed in the data holding sections 2-1 through 2-4, then the next output data from the multiplying section 1 corresponding to the fifth input data is fetched and held by the data holding section 2-1 which has first held the data. Thus, sets of four-piece data sequentially output from the multiplying section 1 corresponding to the input data are cyclically held by the data holding sections 2-1, etc.

The data selectors 3-1 through 3-4 output data whose values change stepwise corresponding to a step function by sequentially reading four pieces of data held in the one-to-one corresponding to data holding sections 2-1 through 2-4 in a predetermined order. Practically, for example, when four pieces of data (−D, +3D, +5D, and −7D) obtained by multiplying the data D by the above mentioned four types of multiplicators are held in the data holding section 2-1, the data selector 3-1 cyclically reads the held digital data in the order of −D, +3, +5D, −7D, −7D, +5D, +3D, and −D at predetermined time intervals, thereby outputting the data of step functions having a value proportional to the input data D.

The adding section 4 adds up digitally the values of the step functions output from four data selectors 3-1 through 3-4. The D/A converter 5 generates an analog voltage corresponding to the stepwise digital data output by the adding section 4. Since the D/A converter 5 generates a constant analog voltage proportional to the value of the input digital data, an output voltage in the form of steps can be obtained.

The two serially connected integrating circuits 6-1 and 6-2 perform two integrating processes on the output voltage in the form of steps appearing at the output terminal of the D/A converter 5. A linearly changing output voltage (like a linear function) is obtained from the integrating circuit 6-1 at the first stage, and an output voltage changing like a quadric function is obtained from the integrating circuit 6-2 at the subsequent stage. Thus, when plural pieces of digital data are input at predetermined intervals to the multiplying section 1, continuous analog signals connected through a smooth curve differentiable only once in the voltage values corresponding to respective pieces of digital data are obtained from the integrating circuit 6-2 at the subsequent stage.

Figure 6:
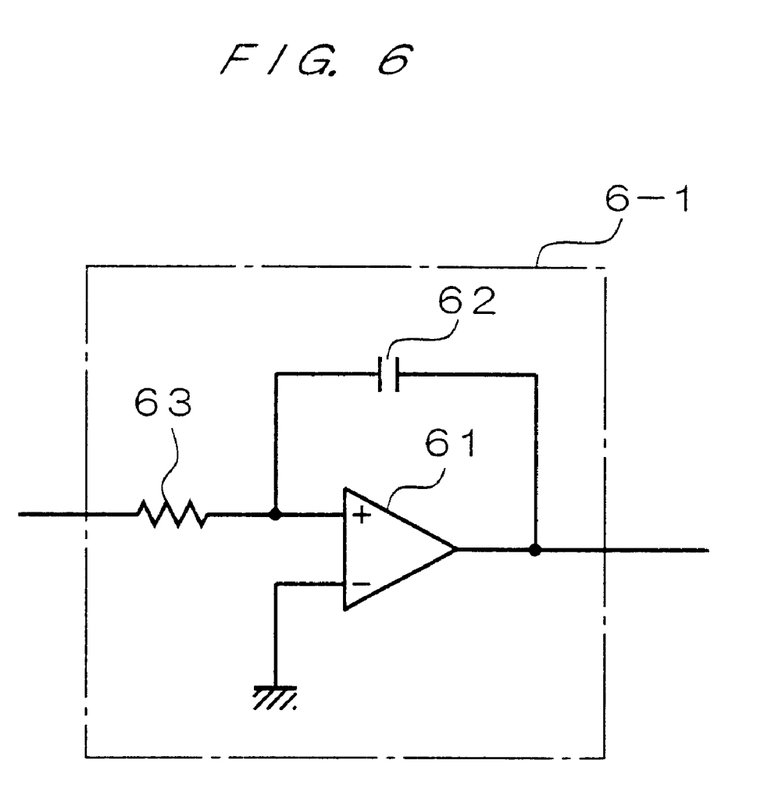
FIG. 6 is a diagram showing a detailed configuration of an integrating circuit.

FIG. 6 shows an example of a practical configuration of an integrating circuit. In FIG. 6, an example of a practical configuration of the integrating circuit 6-1, but the integrating circuit 6-2 can also be realized with the similar configuration. The integrating circuit 6-1 shown in FIG. 6. is a common analog integrating circuit comprising an operational amplifier 61, a capacitor 62, and a resistance 63. A predetermined integrating operation is performed on the voltage applied to one terminal of the resistance 63.

The above mentioned multiplying section 1 corresponds to multiplying unit, the combinations of the data holding section 2-1, or the like, and the data selector 3-1, or the like correspond to the step function generation unit, the adding section 4 corresponds to the adding unit, the D/A converter 5 corresponds to the stepwise voltage waveform generation unit, and the integrating sections 6-1 and 6-2 correspond to integrating unit, respectively.

Figure 7A:
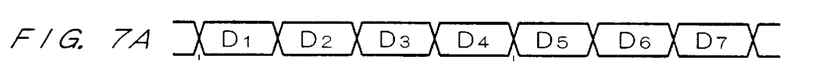
FIGS. 7A through 7L are charts showing the operation timings of the D/A converter of an embodiment; and, FIG. 8 is a diagram showing a detailed configuration of the multiplying section.
Figure 7B:
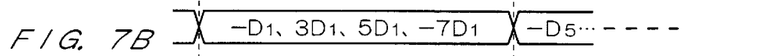
Figure 7C:
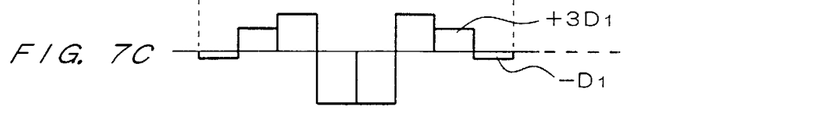

FIGS. 7A to 7L are charts showing the operation timings of the oversampling circuit in this embodiment. As shown in FIG. 7A, if the digital data $D_1$, $D_2$, $D_3$, ... are input at a constant time interval, each of the data holding sections 2-1 through 2-4 holds four data corresponding to these digital data $D_1$, $D_2$, $D_3$, ... cyclically. More specifically, the data holding section 2-1 fetches four data $-D_1$, $+3D_1$, $+5D_1$, $-7D_1$ output from the multiplying section 1 corresponding to the first input data $D_1$, and holds the data till the input digital data is circulated (or till four data corresponding to a fifth input data $D_5$ ($-D_5$, $+3D_5$, $+5D_5$, $-7D_5$) is input) (FIG. 7B). The data selector 3-1 reads out four data corresponding to the first input data $D_1$ in predetermined order, and generates a step function having a value proportional to the input data $D_1$ (FIG. 7C).

Figure 7D:
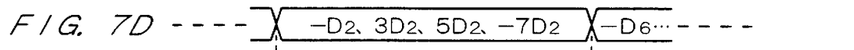

Similarly, the data holding section 2-2 fetches four data $-D_2$, $+3D_2$, $+5D_2$, $-7D_2$ output from multiplying section 1 corresponding to the second input data $D_2$, and holds the data till the input digital data is circulated (or till four data corresponding to a sixth input data $D_6$ is input) (FIG. 7D). The data selector 3-2 reads out four data corresponding to the second input data $D_2$ in predetermined order, and generates a step function having a value proportional to the input data $D_2$ (FIG. 7E).

Figures 7E, 7F:
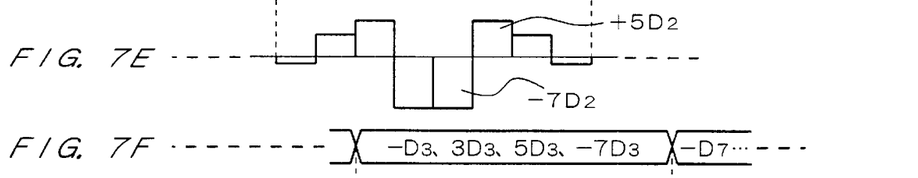
Figure 7G:
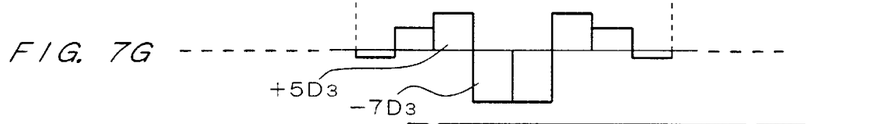

The data holding section 2-3 fetches four data $-D_3$, $+3D_3$, $+5D_3$, $-7D_3$ output from multiplying section 1 corresponding to the third input data $D_3$, and holds the data till the input digital data is circulated (or till four data corresponding to a seventh input data $D_7$ is input) (FIG. 7F). The data selector 3-3 reads out four data corresponding to the third input data $D_3$ in predetermined order, and generates a step function having a value proportional to the input data $D_3$ (FIG. 7G).

Figure 7H:
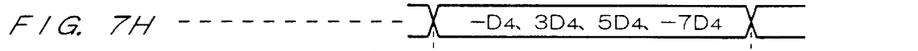
Figure 7I:
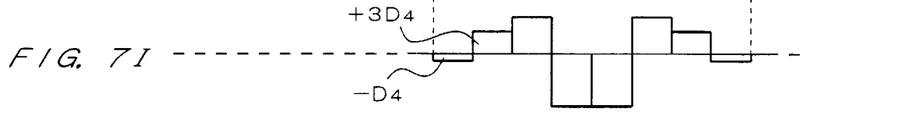

The data holding section 2-4 fetches four data $-D_4$, $+3D_4$, $+5D_4$, $-7D_4$ output from multiplying section 1 corresponding to the fourth input data $D_4$, and holds the data till the input digital data is circulated (or till four data corresponding to a eighth input data $D_8$ is input) (FIG. 7H). The data selector 3-4 reads out four data corresponding to the fourth input data $D_4$ in predetermined order, and generates a step function having a value proportional to the input data $D_4$ (FIG. 7I).

The adding section 4 adds values of step functions output from each of four data selectors 3-1 through 3-4 in this way.

By the way, the step function generated by each of the data selectors 3-1 through 3-4 as shown in FIG. 4 is a function of a local support having eight piecewise sections divided at every 0.5 from a region of the sample position t=−2 to +2 in which the sampling function of FIG. 1 has finite values. For example, a first piecewise section, a second piecewise section, . . . , and an eighth piecewise section are defined in a direction from the sample position t=−2 to +2.

More specifically, the adding section 4 at first adds a value (+3$D_1$) corresponding to the seventh piecewise section that is output from the data selector 3-1, a value (−7$D_2$) corresponding to the fifth piecewise section that is output from the data selector 3-2, a value (+5$D_3$) corresponding to the third piecewise section that is output from the data selector 3-3, and a value (−$D_4$) corresponding to the first piecewise section that is output from the data selector 3-4 to output a result of addition (+3$D_1$ −7$D_2$ +5$D_3$ −3$D_4$).

Then, the adding section 4 adds a value (−$D_1$) corresponding to the eighth piecewise section that is output from the data selector 3-1, a value (+5$D_2$) corresponding to the sixth piecewise section that is output from the data selector 3-2, a value (−7$D_3$) corresponding to the fourth piecewise section that is output from the data selector 3-3, and a value (+3$D_4$) corresponding to the second piecewise section that is output from the data selector 3-4 to output a result of addition (−$D_1$ +5$D_2$ −7$D_3$ +3$D_4$)

Figure 7J:
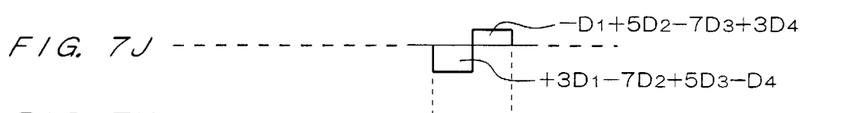

Thus, when the adding section 4 sequentially outputs a step-shaped addition result, the D/A converter 5 generates an analog voltage based on the addition result (digital data). Since the D/A converter 5 generates a constant analog voltage proportional to the value of the input digital data, an output waveform formed by a changing voltage level stepwise corresponding the input digital data can be obtained (FIG. 7J).

Figure 7K:
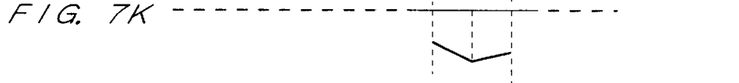
Figure 7L:
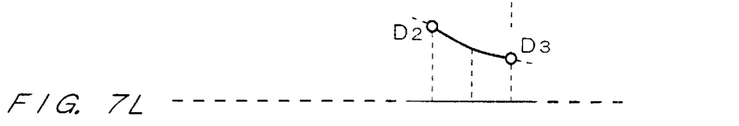

When the D/A converter 5 outputs a wave form having a stepwise voltage level, the integrating circuit 6-1 at the preceding stage outputs a polygonal line waveform by integrating the waveform (FIG. 7K), the integrating circuit 6-2 at the subsequent stage further integrates the polygonal line waveform, and generates an output voltage connected through a smooth curve differentiable only once in the voltage values corresponding to the digital data $D_2$ and $D_3$ (FIG. 7L).

Thus, the D/A converter according to the present embodiment holds the four multiplication results as a unit corresponding to each input digital data in the four data holding sections 2-1 through 2-4 cyclically. The data selectors 3-1 through 3-4 read out the four held data in predetermined order, thereby generating the step functions. Then, adding section 4 adds the values of the step function while corresponds to the four input data. The D/A converter 5 generates an analog voltage corresponding to the addition result, and then the two integrating circuits 6-1 and 6-2 perform two integrating processes, thereby generating continuous analog signals smoothly connecting the voltage values corresponding to the input digital data.

The continuous analog signals can be obtained by generating step functions corresponding to the four pieces of input digital data, adding up the values of step functions, generating an analog voltage corresponding to the addition result, and performing two integrating processes. Therefore, the conventional sample hold circuit or low pass filter is not required, thereby preventing deterioration in a linear phase characteristic, reducing the distortion of an output waveform, and realizing a desired group delay characteristic.

Furthermore, since the conventional oversampling process is not performed, it is necessary only to guarantee a predetermined operation speed depending on the time intervals of input digital data, and since it is unnecessary to perform any high speed signal processing, no expensive parts are required. For example, the conventional D/A converter performs the oversampling process to obtain 1024 pseudo-frequencies as sampling frequencies, thereby requiring the operation speeds of respective parts depending on the pseudo frequencies. On the other hand, it is necessary for the D/A converter according to the present embodiment only to operate each multiplier or each adder at a frequency two times as high as the sampling frequency, and consequently it is possible to reduce the operation speeds of the respective parts to a large extent.

Figure 8:
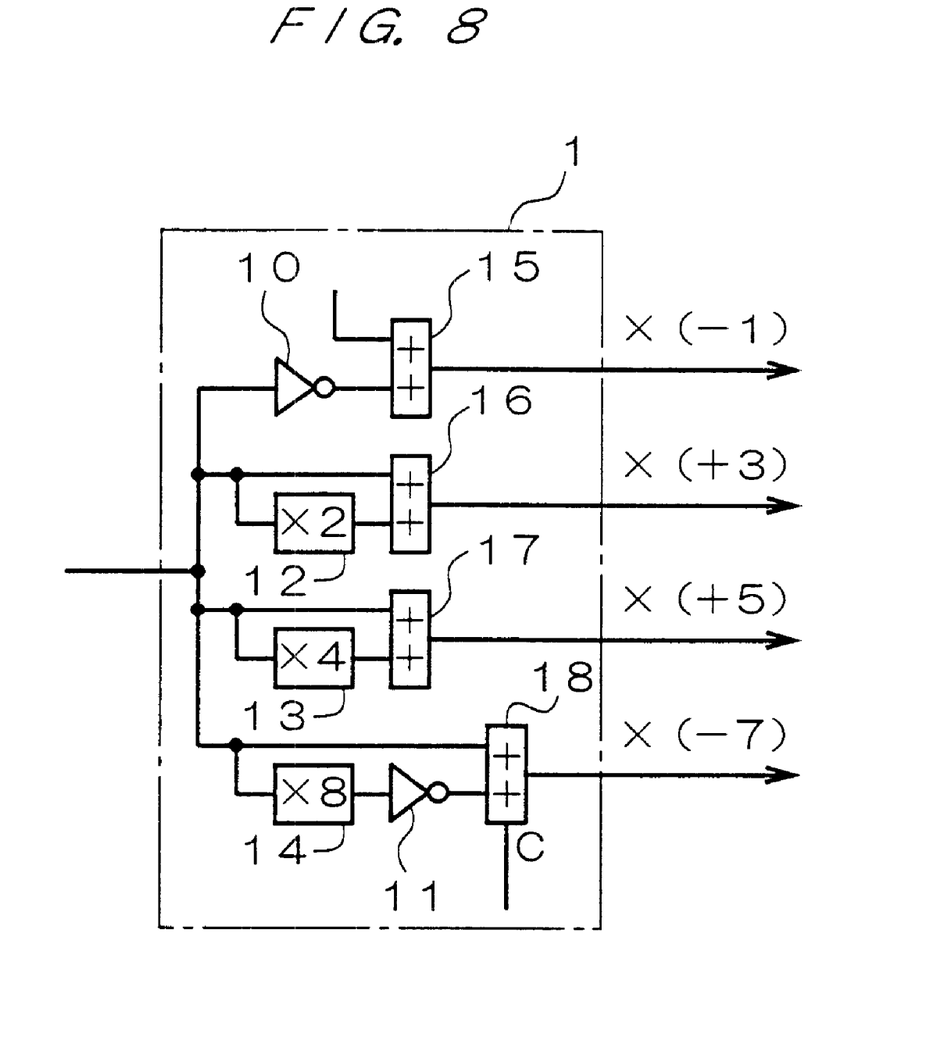

FIG. 8 shows the detailed configuration of the multiplying section 1 shown in FIG. 5. The multiplying section 1 shown in FIG. 8 comprises two inverters 10 and 11 for inverting the logic of each bit of the input data and outputting the result, a multiplier 12 for multiplying by the multiplicator of 2, a multiplier 13 for multiplying by the multiplicator of 4, a multiplier 14 for multiplying by the multiplicator of 8, and four adders 15, 16, 17, and 18.

For example, when data $D_1$ is input into the multiplying section 1 which has the configuration as, mentioned above, the inverter 10 outputs the data obtained by inverting the logic of each bit of the input data $D_1$, the adder 15 adds 1 to the lowest bit of each piece of the output data, thereby obtaining the complement of the input data $D_1$. This equivalently shows the value (−$D_1$) obtained by multiplying the input data $D_1$ by −1. Furthermore, the multiplier 12 outputs a value (+2$D_1$) two times as large as the value of the input data $D_1$, and the adder 16 adds the original input data $D_1$ to the data, thereby obtaining the value (+3$D_1$) three times as large as the input data $D_1$. Similarly, the multiplier 13 outputs a value (+4$D_1$) four times as large as the input data $D_1$, and the adder 17 adds the value to the original input data $D_1$, thereby obtaining a value (+5$D_1$) five times as large as the input data $D_1$. Additionally, the multiplier 14 outputs a value (+8$D_1$) eight times as large as the input data $D_1$, the inverter 11 inverts the logic of each bit of the output data, and the adder 18 adds the original input data $D_1$ to the inverted data. The adder 18 has a valid carry terminal C, and adds 1 to the lowest bit of the output data of the inverter 11, thereby obtaining the complement of the output data of the inverter 11. Therefore, a value (−7$D_1$) −7 times as large as the input data $D_1$ can be obtained adding the original input data $D_1$ to the value (−8$D_1$) −8 times as large as the input data $D_1$ by means of the adder 18.

Since the multiplicators are power of 2, the above mentioned three multipliers 12, 13, and 14 can perform the multiplying process only by performing bit shifting operation. Thus, by combining the multiplying process of the power of 2 by the bit shift with the adding process, the multiplying process is performed by four multiplicators, thereby simplifying the configuration.

The present invention is not limited to the above mentioned embodiment, and various types of embodiments can be set within the scope of the gist of the present invention. For example, according to the above mentioned embodiment, a sampling function is defined as a function of local support differentiable only once in the whole range, but the times of differentiation can be set to a value equal to or larger than 2. In this case, the number of integrating circuits is to match the number of times of differentiation.

The sampling function of this embodiment converges to zero at t=±2, as shown in FIG. 1, but may converge to zero at t=±3 or beyond. For example, in a case of the sampling function converging to zero at t=±3, six data holding sections and six data selectors may be contained in the D/A converter shown in FIG. 5, to interpolate for the six digital data.

Furthermore, it is not limited to the interpolating process using a sampling function of local support, but using a sampling function differentiable finite times having a predetermined value in the range from $-\infty$ to $+\infty$, an interpolation process may be performed only for plural digital data corresponding to finite sample position. For example, assuming that the sampling function is defined by a quadric piecewise polynomial, a predetermined step function waveform can be obtained by twice differentiating each piecewise polynomial. A voltage is combined using this step function waveform, and a resulting voltage is integrated twice to get an analog signal connecting smoothly the voltages corresponding to the digital data.

INDUSTRIAL APPLICABILITY

As described above, according to the present invention, the values of the step functions corresponding to sequentially input plural pieces of digital data are added up, and then the addition result is converted into an analog voltage and integrated, thereby obtaining continuously changing analog signals. As a result, it is not necessary to use a low pass filter to obtain a final analog signal, a group delay characteristic is not deteriorated by different phase characteristics depending on the applicable signal frequencies, and therefore an output waveform can be obtained with less distortion. As compared with the conventional method used with oversampling, the cost of parts can be reduced because it is not necessary to speed up the operations of the parts and to use expensive parts.

What is claimed is:

1. A digital-to-analog converter, characterized by comprising:

a multiplying unit for performing a plurality of multiplying process using plural multiplicators on plural pieces of digital data inputted at a predetermined intervals;

a plurality of step function generation unit for generating step function corresponding to each of the plural pieces of digital data using plural of multiplication result obtained by the multiplying unit synchronized with an input timing of each of the plural pieces of digital data;

an adding unit for performing a process of adding up values of the step function generated by the plurality of step function generation unit;

a stepwise voltage waveform generation unit for generating a stepwise analog voltage corresponding to the digital data obtained by the adding unit; and an integrating unit for performing analog integration plural times on the analog voltage generated by said stepwise voltage waveform generation unit, whereby a final analog signal output is produced by said integrating unit in the absence of passing an output of said integrating unit through a low pass filter.

2. A digital-to-analog converter, characterized by comprising:

a multiplying unit for performing a plurality of multiplying process using plural multiplicators on plural pieces of digital data inputted at a predetermined intervals;

a plurality of step function generation unit for generating step function corresponding to each of the plural pieces of digital data using plural of multiplication result obtained by the multiplying unit synchronized with an input timing of each of the plural pieces of digital data;

an adding unit for performing a process of adding up values of the step function generated by the plurality of step function generation unit;

a stepwise voltage waveform generation unit for generating a stepwise analog voltage corresponding to the digital data obtained by the adding unit; and an integrating unit for performing analog integration plural times on the analog voltage generated by said stepwise voltage waveform generation unit, characterized in that each of the multiplicators used in the multiplying process by said multiplying unit corresponds to each of the values of step functions obtained by differentiating plural times piecewise polynomials for a predetermined sampling function configured by the piecewise polynomials.

3. The digital-to-analog converter according to claim 2, wherein said step function comprises a positive region and a negative region set to have an equal area.

4. The digital-to-analog converter according to claim 3, wherein said sampling function is differentiable only once over the whole range and has values of local support.

5. The digital-to-analog converter according to claim 2, characterized in that said step function consists of eight piecewise sections in equal width with a weight of $-1$, $+3$, $+5$, $-7$, $-7$, $+5$, $+3$, and $-1$ in a predetermined range corresponding to said five digital data arranged at an equal interval, and that the eight weight coefficients are set as the multiplicators in said multiplying unit.

6. The digital-to-analog converter according to claim 5, characterized in that a multiplying process performed in said multiplying unit is realized by adding said digital data to an operation result of an exponentiation of 2 by a bit shift.

7. A digital-to-analog converter, characterized by comprising:

a multiplying unit for performing a plurality of multiplying process using plural multiplicators on plural pieces of digital data inputted at a predetermined intervals;

a plurality of step function generation unit for generating step function corresponding to each of the plural pieces of digital data using plural of multiplication result obtained by the multiplying unit synchronized with an input timing of each of the plural pieces of digital data;

an adding unit for performing a process of adding up values of the step function generated by the plurality of step function generation unit;

a stepwise voltage waveform generation unit for generating a stepwise analog voltage corresponding to the digital data obtained by the adding unit; and an integrating unit for performing analog integration plural times on the analog voltage generated by said stepwise voltage waveform generation unit, characterized in that times of said analog integration is two, and an analog signal whose voltage level changes like a quadric function is output from said integrating unit.

* * * * *